United States Patent [19]

Uchida et al.

[11] Patent Number: 5,258,426
[45] Date of Patent: *Nov. 2, 1993

[54] SEMICONDUCTOR DEVICE ENCAPSULANT

[75] Inventors: Ken Uchida, Tokyo; Shinetsu Fujieda; Michiya Higashi, both of Kawasaki; Hiroshi Shimozawa; Akira Yoshizumi, both of Yokohama, all of Japan

[73] Assignee: Kabushiki Kaisha Toshiba, Kawasaki, Japan

[*] Notice: The portion of the term of this patent subsequent to Nov. 26, 2008 has been disclaimed.

[21] Appl. No.: 484,676

[22] Filed: Feb. 20, 1990

[30] Foreign Application Priority Data

Feb. 23, 1989 [JP] Japan .................... 1-43510

[51] Int. Cl.$^5$ .............................. C08L 63/00
[52] U.S. Cl. .................... 523/435; 523/436; 428/413; 428/473.5; 524/504
[58] Field of Search ............. 428/413, 473.5; 523/435, 436; 524/504

[56] References Cited

U.S. PATENT DOCUMENTS

| | | | |
|---|---|---|---|
| 4,552,907 | 11/1985 | Sato et al. | 523/455 |
| 4,719,255 | 1/1988 | Yoshizumi et al. | 523/436 |
| 4,902,732 | 2/1990 | Itoh et al. | 525/433 |
| 4,916,174 | 4/1990 | Yoshizumi et al. | 523/436 |
| 4,965,657 | 10/1990 | Ogata et al. | 357/72 |
| 4,985,751 | 1/1991 | Shiobara et al. | 357/72 |

FOREIGN PATENT DOCUMENTS

| | | |
|---|---|---|
| 0031904 | 7/1981 | European Pat. Off. . |
| 0285450 | 10/1988 | European Pat. Off. . |
| 2019436 | 11/1970 | Fed. Rep. of Germany . |
| 3739489 | 6/1988 | Fed. Rep. of Germany . |
| 54-54168 | 5/1979 | Japan . |
| 58-34824 | 3/1983 | Japan . |
| 62-22825 | 1/1987 | Japan . |
| 62-184012 | 8/1987 | Japan . |

OTHER PUBLICATIONS

Preprint for 36th "Netsu Kokasei Jushi Toronkai" K. Yamamoto; Oct. 23, 1986.
*World Patents Index Latest* Derwent Publications Ltd., London GB: AN 87-296487 & JP14 A-62 209 126 (Toshiba KK) Sep. 14, 1987 abstract.

*Primary Examiner*—Paul R. Michl
*Assistant Examiner*—Edward J. Cain
*Attorney, Agent, or Firm*—Oblon, Spivak, McClelland, Maier & Neustadt

[57] ABSTRACT

A semiconductor device encapsulant contains (a) a thermosetting resin for providing a cured product having a glass transition temperature of not less than 190° C., (b) a filler consisting of a fused silica, (c) a modifier consisting of an MBS or ABS, (d) a modifier consisting of a silicone rubber or a silicone gel, and (e) a lubricant containing a metal chelate compound.

18 Claims, No Drawings

SEMICONDUCTOR DEVICE ENCAPSULANT

BACKGROUND OF THE INVENTION

1. Field of the Invention

The present invention relates to a semiconductor device encapsulant consisting of a resin composition for providing a cured product having a high thermal shock resistance and a high humidity resistance.

2. Description of the Related Art

An epoxy resin composition containing a phenol-novolak resin as a curing agent has been conventionally used as a semiconductor device encapsulant. This resin composition is mainly used as an encapsulant since a cured product of this composition has a high humidity resistance, good high-temperature electrical characteristics, and good molding properties.

In recent years, as semiconductor devices have been more integrated, each functional unit on an element has been more miniatualized and a size of a semiconductor pellet itself has been rapidly increased. Due to such changes in a pellet, conventional encapsulants therefore cannot satisfy requirements such as a high thermal shock resistance. That is, if a conventional epoxy resin composition is used to encapsulate a large pellet having a fine surface structure, a phospho-silicate glass (PSG) film or a silicon nitride ($Si_3N_4$) film as a passivation film for an aluminum (Al) pattern formed on the surface of the pellet may crack, or the encapsulating resin may crack. This tendency becomes significant especially when a heat cycle test is conducted. As a result, an outer appearance of a package is degraded or reliability of a semiconductor device is lowered.

In addition, when a surface-mounting type package is soldered, the entire package is exposed to a high-temperature atmosphere at 200° C. to 260° C. for 5 to 90 seconds and subjected to a severe thermal shock. In this case, an encapsulating resin may crack mainly due to vaporization of moisture entrapped in the package.

In order to solve the above problems, a stress applied on an insert by the encapsulating resin must be reduced and the encapsulating resin itself must be strengthened throughout a wide temperature range.

In order to reduce the internal stress of an encapsulating resin, a so-called sea-island structure in which silicone oil or natural rubber is finely dispersed in a resin matrix is assumed to be effective. Actually, this method can considerably reduce the internal stress of an encapsulating resin. This method, however, has a problem of inevitably reducing the strength of the encapsulating resin and has almost no effect of preventing cracks of the encapsulating resin at a high temperature.

SUMMARY OF THE INVENTION

It is, therefore, an object of the present invention to provide a semiconductor device encapsulant capable of providing a cured product having a small internal stress, good mechanical characteristics at a high temperature, and high thermal resistance and humidity resistance.

An encapsulating resin composition of the present invention is characterized by containing:

(a) a thermosetting resin for providing a cured product having a glass transition temperature of 190° C. or more;

(b) a filler consisting of a fused silica;

(c) a modifier consisting of an MBS or ABS;

(d) a modifier consisting of a silicone rubber or a silicone gel; and (e) a lubricant containing a metal chelate compound.

A cured product of the semiconductor device encapsulant of the present invention has a high thermal shock resistance and a good solder dipping property. This semiconductor device encapsulant be suitably used to encapsulate a semiconductor device, especially a large-capacity memory. A resin-encapsulated semiconductor device encapsulated by this encapsulant can maintain high humidity resistance and reliability even after it is surface-mounted.

DETAILED DESCRIPTION OF THE PREFERRED EMBODIMENT

In the present invention, (a) a thermosetting resin for providing a cured product having a glass transition temperature of 190° C or more may be any resin as long as the resin can produce a cured product which is three-dimensionally crosslinked upon heating and has a glass transition temperature of 190° C. or more. Preferably, an epoxy-based or maleimide-based thermosetting resin is used. The glass transition temperature is obtained from a thermal expansion curve. That is, in a thermal expansion curve indicating a relationship between a temperature and thermal expansion, curves before and after a region in which an inclination rapidly changes are assumed to be straight lines, and a temperature at an intersection between a straight line as an axis of symmetry of these straight lines and the thermal expansion curves is obtained as a glass transition temperature. Also in the present invention, a glass transition temperature means a temperature obtained by this method.

Of the thermosetting resins for providing a cured product having a glass transition temperature of 190° C. or more, an epoxy resin may be any resin as long as the resin has two or more epoxy groups in one molecule. Note that an epoxy resin having an epoxy equivalent weight of 250 or less is preferred in terms of a heat resistance. Examples of such an epoxy resin are a phenol-novolak epoxy resin, a cresol-novolak epoxy resin, a naphthol-novolak epoxy resin, a bisphenol A-novolak epoxy resin, a tris(hydroxyphenyl)alkane-based epoxide obtained by epoxydizing a condensate of a phenol or alkylphenol and hydroxybenzaldehyde, a tetra(hydroxyphenyl)alkane epoxide, 2,2',4,4'-tetraglycidoxybenzophenone, triglycidylether of paraaminophenol, polyallylglycidylether, 1,3,5-triglycidyletherbenzene, and 2,2',4,4'-tetraglycidoxybiphenyl. These epoxy resins are used singly or in a combination of two or more thereof.

A curing agent is generally used for the epoxy resin. The curing agent for the epoxy resin is not particularly limited but may be, e.g., a phenolic resin, an organic anhydride, and an amine.

More specifically, examples of the phenolic resin to be used as the curing agent for the epoxy resin are a novolak-type phenolic resin such as a phenol-novolak resin, a cresol-novolak resin, a tert-butylphenol-novolak resin, a nonylphenol-novolak resin, a novolak resin of bisphenol F, a novolak resin of bisphenol A, and a naphthol-novolak resin; a polyoxystyrene such as polyparaoxystyrene; a phenol-aralkyl resin of a condensation polymer of 2,2'-dimethoxy-p-xylene and a phenol monomer; and a tris(hydroxyphenyl)alkane-based compound represented by the following formula:

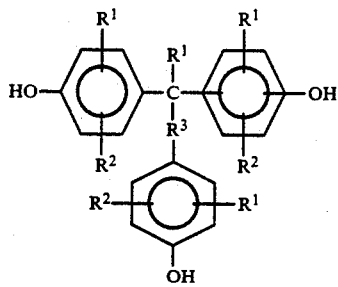

(wherein each of $R^1$ and $R^2$ independently represents a hydrogen atom or an alkyl group having 1 to 20 carbons. There groups may be the same or different. $R^3$ represents a carbon-carbon single bond or an alkylene group such as methylene or ethylene.)

These phenolic resins are used singly or in a combination of one or two thereof.

The organic anhydride to be used as the curing agent for the epoxy resin may be any of aliphatic, alicyclic, and aromatic carboxylic anhydrides or derivatives thereof. Examples of the organic anhydrides are a maleic anhydride, a succinic anhydride, a phthalic anhydride, a tetrahydrophthalic anhydride, a hexahydrophthalic anhydride, a trimellitic anhydride, a pyromellitic anhydride, a nagic anhydride (3,6-endomethylene-1,2,3,6-tetrahydrophthalic anhydride), a methylnagic anhydride, a 3,3,4,4'-benzophenonetetracarboxylic anhydride, a tetrabromophthalic anhydride, and a chlorendic anhydride. These organic anhydrides are used singly or in a combination of two or more thereof.

Examples of the amine to be used as the curing agent for the epoxy resin are diamines such as 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, 4,4'-diaminodiphenyloxide, 4,4'-diaminodiphenylsulfone, bis(4-aminophenyl)-methylphosphineoxide, bis(4-aminophenyl)methylamine, 1,5-diaminonaphthalene, m-xylylenediamine, 1,1-bis(p-aminophenyl)phlathane, p-xylylenediamine, hexamethylenediamine, 6,6'-diamino-2,2-dipyridyl, 4,4'-diaminobenzophenone, 4,4'-diaminoazobenzene, bis(4-aminophenyl)phenylmethane, 1,1-bis(4-aminophenyl)-cyclohexane, 1,1-bis(4-aminophenyl-3-methylphenyl)-cyclohexane, 2,5-bis(p-aminophenyl)-1,3,4-oxadiazole, 2,5-bis(m-aminophenyl)-1,3,4-oxadiazole, 2,5-bis(m-aminophenyl)thiazolo(4,5-d)thiazole, 5,5'-di(m-aminophenyl)-2,2'-bis(1,3,4-oxadiazolyl), 4,4'-diaminodiphenylether, 4,4'-bis(p-aminophenyl)-2,2'-dithiazole, m-bis(4-p-aminophenyl-2-thiazolyl)benzene, 4,4'-diaminophenylbenzoate, N,N'-bis(4-aminobenzyl)-p-phenylenediamine, 4,4'-methylene-bis(2-chloroaniline), 2,2-bis[4-(4-aminophenoxy)phenyl]sulfone, bis[4-(4-aminophenoxy)phenyl]sulfone, 1,4-bis(4-aminophenoxy)benzene, 1,3-bis(4-aminophenoxy)benzene, and 1,3-bis(3-aminophenoxy) benzene; and aromatic polyfunctional amines represented by the following formulas:

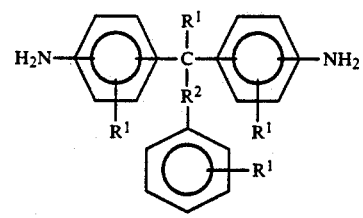

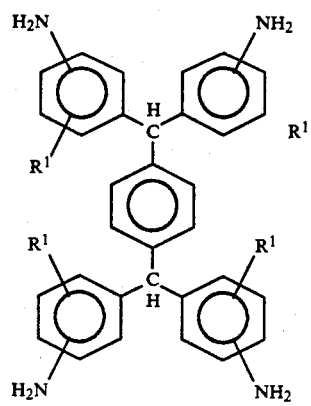

(wherein $R^1$ represents a hydrogen atom or an alkyl group having 1 to 20 carbons. These groups may be the same or different. $R^2$ represents a single bond or an alkylene group such as methylene or ethylene.)

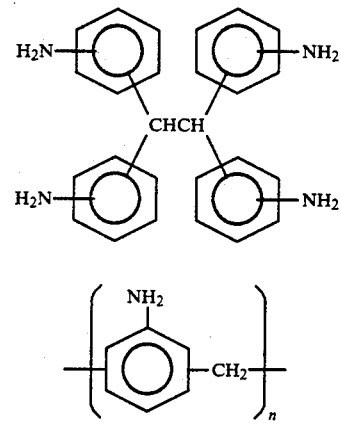

These amines are used singly or in a combination of two or more thereof.

A blending amount of a curing agent preferably falls within the range of 0.5 to 1.5 equivalent weight, and more preferably, 0.8 to 1.2 equivalent weight per equivalent weight of the epoxy resin in terms of a heat resistance, mechanical characteristics, and a humidity resistance.

A curing accelerator may be used to accelerate a reaction between the epoxy resin and the curing agent. The type of curing accelerator is not particularly limited. Examples of the curing accelerator are an imidazole such as 2-methylimidazole, 2,4-dimethylimidazole, 2-ethyl-4-methylimidazole, 2-phenylimidazole, 2-phenyl-4-methylimidazole, and 2-heptadecylimidazole; a tertiary amine such as triethylamine, benzyldimethylamine, α-methylbenzylmethyldiamine, 2-(dimethylaminomethyl)phenol, and 2,4,6-tris(dimethylaminomethyl)phenol; an organic phosphine such as triphenylphosphine, tricyclohexylphosphine, tributylphosphine, and methyldiphenylphosphine; and diazabicycloundecene.

These curing accelerators are used singly or in a combination of two or more thereof.

Since activity of a curing accelerator depends on the type of accelerator, a preferable range of its addition amount cannot be generally determined. The addition amount, however, preferably falls within the range of 0.1 to 5 wt % with respect to a total amount of the epoxy resing and the curing agent. If the addition amount is less than 0.1 wt %, a curing reaction cannot be satisfactorily accelerated. If the addition amount exceeds 5 wt %, a humidity resistance of a cured product is degraded.

In the present invention, of the thermosetting resins for providing a cured product having a glass transition temperature of 190° C. or more, examples of the maleimide resin are an N,N'-substituted maleimide represented by the following formula:

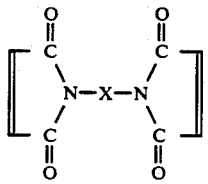

(wherein X represents a divalent hydrocarbon group such as an alkylene group, a cycloalkylene group, and a monocyclic or polycyclic arylene group, or a divalent hydrocarbon group bonded by a divalent atom group such as —CH$_2$—, —CO—, —SO$_2$— or —CONH—), or a poly(phenylmethylene)polymaleimide represented by the following formula:

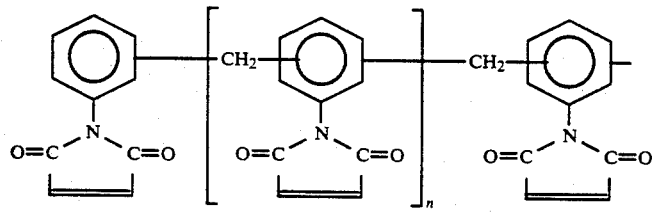

(wherein n represents 1 to 5).

Examples of the maleimide resin are N,N'-phenylenebismaleimide, N,N'-hexamethylenebismaleimide, N,N'-diphenylmethanebismaleimide, N,N'-oxydi-p-phenylenebismaleimide, N,N'-4,4'-benzophenonebismaleimide, N,N'-p-diphenylsulfonebismaleimide, N,N'-(3,3'-dimethyl)methylene-di-p-phenylenebismaleimide, poly(phenylmethylene)-polymaleimide, 2,2-bis(4-phenoxyphenyl)propane-N,N'-bismaleimide, bis(4-phenoxyphenyl)sulfone-N,N'-bismaleimide, 1,4-bis(4-phenoxy)benzene-N,N'-bismaleimide, 1,3-bis(4-phenoxy)benzene-N,N'-bismaleimide, and 1,3-bis(3-phenoxy)benzene-N,N'-bismaleimide. These maleimide resins are used singly or in a combination of two or more thereof.

When a maleimide resin is used, the content of an organic acid in the resin largely affects the physical properties of a cured product. That is, if purification of the maleimide resin is unsatisfactory and a large amount of an organic acid remains, corrosion of an Al wiring layer on a semiconductor pellet progresses to degrade a humidity resistance of a cured product. Therefore, the residual organic acid amount is preferably 0.1% or less. A method of manufacturing the maleimide resin is not particularly limited. Examples of the manufacturing method are a method in which maleinamic acid is synthesized in a reaction solvent and subjected to a ring-closing dehydration by using acetic anhydride to prepare a maleimide resin, and the prepared resin is purified, and a method in which maleinamic acid is directly subjected to a ring-closing dehydration in a reaction solvent to prepare a maleimide resin, and the prepared maleimide resin is purified. In order to minimize the residual organic acid amount as described above, the latter method is preferred.

In order to improve the workability and the molding properties, an amine, an epoxy resin, a phenolic resin, or a compound having a vinyl group or an allyl group may be added to the maleimide resin.

Examples of the amine to be added to the maleimide resin are 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, 4,4'-diaminodiphenyloxide, 4,4'-diaminodiphenylsulfone, bis(4-aminophenyl)methylphosphineoxide, bis(4-aminophenyl)methylamine, 1,5-diaminonaphthalene, m-xylylenediamine, 1,1-bis(p-aminophenyl)phlathane, p-xylylenediamine, hexamethylenediamine, 6,6'-diamino-2,2'-dipyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-aminophenyl-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazolo(4,5-d)thiazole, 5,5'-di(m-aminophenyl)-2,2'-bis(1,3,4-oxadiazolyl), 4,4'-diaminodiphenylether, 4,4'-bis(p-aminophenyl)-2,2'-dithiazole, m-bis(4-p-aminophenyl-2-thiazolyl)benzene, 4,4'-diaminobenzanilide, 4,4'-diaminophenylbenzoate, N,N'-bis(4-aminobenzyl)-p-phenylenediamine, 4,4'-methylenebis(2-chloroaniline), 2,2-bis[4-(4-aminophenoxy)phenyl]propane, bis[4-(4-aminophenoxy)phenyl]sulfone, 1,4-bis(4-aminophenoxy)benzene, 1,3-bis(4-aminophenoxy)benzene, and 1,3-bis(3-aminophenoxy)benzene. In addition to these diamines, a polyamine may be used. These amines are used singly or in a combination of two or more thereof.

The maleimide resin and the amine are preferably homogeneously mixed by powder mixing, hot melt mixing, or the like. In terms of especially workability, storage stability, and mechanical characteristics, the two materials are preferably subjected to hot melt mixing and prepolymerized. In this case, a mixing ratio of the amine with respect to the maleimide resin is preferably set to be 0.2 to 0.8 mol per mol of the maleimide resin. If the mixing ratio of the amine is less than 0.2 mol, the workability of a resin composition is degraded.

If the mixing ratio exceeds 0.8 mol, a heat resistance and high-temperature strength of a cured product are degraded.

Examples of the epoxy resin to be added to the maleimide resin are a bisphenol A-type epoxy resin, a novolak-type epoxy resin, an alicyclic epoxy resin, a glycidylester-type epoxy resin, a polyfunctional epoxy resin having a heat resistant structure, and a halogenated epoxy resin. Preferable examples of the epoxy resin are ESCN-195XL (SUMITOMO CHEMICAL CO., LTD.), ESX-221 (SUMITOMO CHEMICAL CO., LTD.), ESMN-220 (SUMITOMO CHEMICAL CO., LTD.), EPPN-502N (NIPPON KAYAKU CO., LTD.), YL-933 (YUKA SHELL EPOXY K.K), and YL-932H (YUKA SHELL EPOXY K.K).

A blending ratio of an epoxy resin is preferably 5 to 50 wt % with respect to a total amount of the maleimide resin and the amine. If the blending ratio of the epoxy resin is less than 5 wt %, the molding property of a resin composition is degraded. If the blending ratio exceeds 50 wt %, a curability of the resin composition and a heat resistance of a cured product are lowered.

Note that as a curing accelerator of the maleimide resin, an organic phosphine, an imidazole or its derivative, DBU (1,8-diazabicyclo(5,4,0)undecene-7) or its phenolate, a peroxide, and the like can be used.

In terms of a humidity resistance, an organic phosphine is preferably used as the curing accelerator of the maleimide resin.

Examples of the organic phosphine to be used as the curing accelerator of the maleimide resin are trimethylphosphine, triethylphosphine, tributylphosphine, triphenylphosphine, tri(p-methylphenyl)phosphine, tri(nonylphenyl)phosphine, methyldiphenylphosphine, dibutylphenylphosphine, tricyclohexylphosphine, 1,2-bis(diphenylphosphino)ethane, and bis(diphenylphosphino)methane. These organic phosphines are used singly or in a combination of two or more thereof.

A blending amount of an organic phosphine is preferably 0.1 to 10 wt %, and more preferably, 0.5 to 5 wt % with respect to a total amount of the maleimide resin and the amine. If the blending amount of the organic phosphine is less than 0.1 wt %, the molding property is degraded since a curing reaction of the maleimide resin cannot be accelerated. If the blending amount exceeds 10 wt %, a heat resistance, a humidity resistance, and electrical characteristics of a cured product are significantly degraded.

In the present invention, (b) a fused silica may be any fused silica as long as it can be used as a filler of a semiconductor encapsulating resin. A blending amount of the fused silica is 65 to 90 wt %, and preferably, 70 to 85 wt % with respect to a total amount of a composition. If the fused silica is less than 65 wt %, no satisfactory thermal shock resistance can be imparted to a cured product. If the blending amount exceeds 90 wt %, the molding property is degraded since a melt viscosity of a composition becomes too high.

The shape and the grain size of the fused silica are not particularly limited. Note that if the fused silica is angular silica, projections of the silica are brought into contact with the surface of a device to locally cause a large stress, resulting in an erroneous operation of the semiconductor device. In order to prevent such an erroneous operation, a maximum grain size of the angular fused silica is preferably 75 μm or less. In addition, in order to prevent a soft error a total content of uranium in the fused silica is preferably 0.5 ppb or less.

In the present invention, the MBS of (c) a modifier is an abbreviation of a methylmethacrylate/butadiene/styrene copolymer. The MBS is manufactured by graft-polymerizing a monomer mainly consisting of a methylmethacrylate and a styrene to a latex styrene/butadiene rubber or polybutadiene rubber. Examples of the methylmethacrylate/butadiene/styrene copolymer are B-22 (Kanegafuchi Chemical Industry Co., Ltd.: SBR component=about 45%), B-28 (Kanegafuchi Chemical Industry Co., Ltd.: SBR component=about 45%), B-56 (Kanegafuchi Chemical Industry Co., Ltd.: SBR component=about 65%), 68K4 (Japan Synthetic Rubber Co., Ltd.: SBR component=about 55%), BTA731 (Kureha Chemical Industry Co., Ltd.), and BTA III NX (Kureha Chemical Industry Co., Ltd.)

Of the above methylmethacrylate/butadiene/styrene copolymers, a copolymer having a butadiene content of 70 wt % or less and a methylmethacrylate content of 15 wt % or more is preferred. If a composition ratio falls outside the above range, an outer appearance of a molded product is degraded.

In the present invention, the ABS of (c) the modifier is an abbreviation of an acrylonitrile/butadiene/styrene copolymer. The ABS is a copolymer manufactured by graft-polymerizing an acrylonitrile and one or more types of aromatic vinyl, or an acrylonitrile, one or more types of aromatic vinyl, and a methacrylate with a polymer mainly consisting of a conjugated diolefin (mainly a butadiene). Examples of the ABS are a copolymer obtained by emulsion-polymerizing an acrylonitrile monomer in the presence of a polybutadiene latex or a styrene/butadiene copolymer latex and solidifying/drying the resultant material, and a copolymer obtained by hot-melt-kneading an acrylonitrile/styrene copolymer and an acrylonitrile/butadiene copolymer. The ABS also includes a copolymer obtained by adding a small amount of another polymerizable monomer to the above copolymers.

Examples of the ABS are Kralastic K-2540 (Sumitomo Nogatak K.K.: specific gravity=1.01, thermal deformation temperature=81° C., flexural modulus=12,000 kg/cm$^2$, and tensile strength=300 kg/cm$^2$), Kralastic K-3125 (Sumitomo Nogatak K.K.: specific gravity=1.00, thermal deformation temperature=79° C., and tensile strength=280 kg/cm$^2$), TELALLOY A-10 (Kanegafuchi Chemical Industry Co., Ltd.: specific gravity=1.05), TELALLOY A-50 (Kanegafuchi Chemical Industry Co., Ltd.: specific gravity=1.06), JSR ABS10 (Japan Synthetic Rubber Co., Ltd.: specific gravity=1.03, thermal deformation temperature=86° C., flexural modulus=18,000 kg/cm$^2$, and tensile strength=350 kg/cm$^2$), JSR ABS15 (Japan Synthetic Rubber Co., Ltd.: specific gravity=1.05, thermal deformation temperature=89° C., flexural modulus=27,000 kg/cm$^2$, and tensile strength 500 kg/cm$^2$), JSR ABS42 (Japan Synthetic Rubber Co., Ltd.: specific gravity=1.05. thermal deformation temperature=105° C., flexural modulus=27,000 kg/cm$^2$ tensile strength=800 kg/cm$^2$), JSR ABS47 (Japan Synthetic Rubber Co., Ltd.: specific gravity=1.05, thermal deformation temperature=103° C., flexural modulus=27,000 kg/cm$^2$, tensile strength=530 kg/cm$^2$), and JSR ABS55 (Japan Synthetic Rubber Co., Ltd.: specific gravity=1.07, thermal deformation temperature=86° C., flexural modulus=20,000 kg/cm$^2$, tensile strength=430 kg/cm$^2$).

The MBS or ABS is used in the form of grains or a powder. An average grain size of the grains or powder is preferably 100μm or less. One or two types of the MBS or ABS are used in an addition amount of preferably 0.1 to 10 wt % with respect to a total amount of the resin composition. If the addition amount is 0.1 wt % or less, no satisfactory thermal shock resistance can be imparted to a cured product. If the addition amount exceeds 10 wt %, a molding property is degraded since a melt viscosity of the resin composition is increased.

In addition, when the MBS or ABS is mixed and dispersed in constituting components of a thermosetting resin heated and melted beforehand, good mechanical characteristics can be imparted to a cured product. Examples of a mixing method are a stirring method by using a mixing blade in a flask, a stirring method using a universal mixer, and a method using a homogenizer in a melting kiln.

In the present invention, a silicone rubber or gel as (d) the modifier may be any rubber or gel as long as it has a flowability at 100° C. or less and is gelled upon heating. Examples of such a silicone rubber or gel are an adduct-type silicone rubber or gel and a condensate-type silicone rubber or gel. Examples of the silicone gel are TSJ-3150 (Toshiba Silicone Co., Ltd.: viscosity at 25° C.=1,100 cP), TSJ-3151 (Toshiba Silicone Co., Ltd.: viscosity at 25° C.=2,300 cP), TSJ-3130 (Toshiba Silicone Co., Ltd.: viscosity at 25° C.=3,800 cP), TSJ-3175 (Toshiba Silicone Co., Ltd.: viscosity at 25° C.=3,100 cP), TSE-3504 (Toshiba Silicone Co., Ltd.: viscosity at 25° C.=10,000 cP), TSE-3051 (Toshiba Silicone Co., Ltd.: viscosity at 25° C.=700 cP), and JCR-6101 (Toray Silicone Co., Ltd.: viscosity at 25° C.=6,500 cP).

The silicone rubber or gel may be added by a so-called integral blending method in which an uncured silicone gel is added to constituting components of a thermosetting resin or a filler and the resultant mixture is stirred. Note that as in the case of the MBS and/or ABS, a preferable addition method is such that the silicone rubber or gel is added to constituting components of a melted thermosetting resin and the resultant material is stirred and mixed. According to this mixing method, a dispersity of the material is improved, and die contamination caused by bleeding of a silicone component when a resin composition is molded can be prevented.

Generally, however, the silicone rubber or gel has poor miscibility with components of a thermosetting resin. Therefore, in order to improve the dispersity upon dispersion of the silicone rubber or gel into the resin, various types of surfactants such as silicone-based and fluorine-based surfactants are preferably added to a melted thermosetting resin.

Examples of the silicone-based surfactant are SF-8419,SF-8410, and SF-8421 (Toray Silicone Co., Ltd.), and that of the fluorine-based surfactant is FLORADO FC430 (Sumitomo 3M Co., Ltd.). An addition amount of the surfactant preferably falls within the range of 0.1 to 10 wt % with respect to the thermosetting resin. If the addition amount is less than the lower limit of the above range, the dispersity of the silicone rubber or gel cannot be improved. If the addition amount exceeds the upper limit of the range, a molding property of a resin composition and a humidity resistance of a cured product are degraded.

A blending ratio of the silicone rubber or gel preferably falls within the range of 0.1 to 5 wt % with respect to a total amount of the resin composition. If the blending ratio of the silicone rubber or gel is less than 0.1 wt %, an effect of reducing an internal stress of a cured product is not satisfactory. If the blending ratio exceeds 5 wt %, the workability upon kneading of a resin composition is degraded, and the strength of a cured product is largely reduced.

In the present invention, examples of a main component of (e) a lubricant containing a metal chelate compound are a hydrocarbon wax, an aliphatic acid-based wax, an aliphatic amide-based wax, and an ester-based wax. More specifically, an ester-based wax such as carnauba wax or montan wax is preferable in terms of a humidity resistance. Other examples are a long chain carboxylic acid and their metal salts such as stearic acid, palmitic acid, zinc stearate, and calcium stearate, and a low molecular weight polyethylene wax. These lubricants are used singly or in a combination of two or more thereof.

The metal chelate compound is used to improve adhesion properties of the lubricant with respect to a lead frame and a device and its water resistance. Examples of the metal chelate compound are a Zr chelate compound, a Ti chelate compound, and an Al chelate compound. Examples of the Zr chelate compound are tetrakisacetylacetonatozirconium, monobutoxytrisacetylacetonatozirconium, dibutoxybisacetylacetonatozirconium, tributoxyacetylacetonatozirconium, tetrakisethylacetatezirconium, butoxytrisethylacetatezirconium, tributoxymonoethylacetylacetatezirconium, tetrakisethyllactatezirconium, dibutoxybisethyllactatezirconium, bisacetylacetonatobisethylacetylacetonatozirconium, monoacetylacetonatotrisethylacetylacetonatozirconium, monoacetylacetonatobisethylacetonatobutoxyzirconium and bisacetylacetonatobisethyllacetonatozirconium. Examples of the Ti chelate compounds and the Al chelate compounds are compounds having legands such as β-diketone, hydroxy carboxylic acid, ketoester, ketoalcohol, and glycol. Of these metal chelate compounds, a Zr chelate compound is most preferable in terms of a humidity resistance and a miscibility with the lubricant.

The lubricant and the metal chelate compound are preferably mixed beforehand. The two materials are preferably mixed at a temperature higher than a melting point of the lubricant. According to this method, the two materials can be homogeneously miscible.

A blending ratio of a metal chelate compound with respect to the lubricant is preferably 0.1 to 50 wt %, and more preferably, 0.5 to 30 wt %.

A blending ratio of a lubricant containing a metal chelate compound with respect to the resin composition falls within the range of 0.01 to 3 wt %, and preferably, 0.1 to 1 wt %. If the blending ratio is too large, no satisfactory humidity resistance can be imparted to a cured product. If the blending ratio is too small, release properties from metal molds are degraded.

The resin composition according to the present invention preferably contains antimony trioxide as a fire retardant assistant. Any antimony trioxide may be used as long as it can be used as a fire retardant assistant of a semiconductor encapsulating resin. If, however, moisture enters into a package and the temperature of an encapsulating resin is increased upon heating of a device, the antimony trioxide may react with halogen atoms of a halogenated epoxy resin or may be brought into contact with another impurity. In order to prevent these drawbacks, the antimony trioxide is preferably treated with an alkoxysilane so that its surface is covered with hydrophobic organic molecules.

Any alkoxysilane may be used in the surface treatment of the antimony trioxide as long as it has at least one hydrophobic group. Examples of the alkoxysilane are methyltrimethoxysilane, methyltriethoxysilane, dimethyldimethoxysilane, dimethyldiethoxysilane, trimethylmethoxysilane, butyltrimethoxysilane, hexyltrimethoxysilane, phenyldimethylethoxysilane, phenyldiethylethoxysilane, triphenylmethoxysilane, and phenyltripentoxysilane. Of these alkoxysilanes, phenyltriethoxysilane or methyltriethoxysilane is most preferable.

A blending ratio of the alkoxysilane to be used in the treatment is 0.01 to 10 parts by weight, and preferably 0.1 to 5 parts by weight with respect to 100 parts by weight of the antimony trioxide. If the blending ratio of the alkoxysilane is less than 0.01 parts by weight, no satisfactory humidity resistance and thermal shock resistance can be imparted to a cured product. If the blending ratio exceeds 10 parts by weight, the surface of a molded product may be smeared.

The treatment of an antimony trioxide using the alkoxysilane is generally performed such that the antimony trioxide and the alkoxysilane are brought into contact with each other in the presence of water and then dried. For example, the antimony trioxide is put in a V-shaped blender and treated under stirring by spraying an aqueous alkoxysilane solution (or a water-organic solvent solution) with air or $N_2$ gas, and the resultant material is dried; the antimony trioxide is dispersed in water or an organic solvent to prepare a slurry, and an aqueous solution and/or an organic solvent solution of the alkoxysilane is added to the slurry. The resultant mixture is stirred and left to stand to precipitate the antimony trioxide, and the precipitated antimony trioxide is dried; and an aqueous solution and/or organic solvent solution of the alkoxysilane is sprayed on a high-temperature antimony trioxide extracted from a heating furnace. Note that the method is not limited to these methods.

A blending ratio of the antimony trioxide is preferably 0.2 to 5 wt % with respect to a total amount of the resin composition. If the blending ratio is less than 0.2 wt %, no satisfactory fire retardant properties can be obtained unless a large amount of a fire retardant epoxy resin is added. Therefore, a high humidity resistance cannot be imparted to a cured product. If the blending ratio exceeds 5 wt %, no satisfactory humidity resistance can be imparted to the cured product. More preferably, the blending ratio is 0.5 to 3 wt %.

In addition to the above components, the resin composition of the present invention may contain a silane-, borane-, or titanate-based coupling agent; a fire retardant agent containing a phosphorus compound, bromine, or chlorine; and a pigment such as carbon black as needed. If an especially high humidity resistance is required, various types of ion trapping agents may be effectively added. Examples of the ion trapping agent are DHT-4A (Kyowa Kagaku K.K.) and IXE-600 (TOAGOSEI CHEMICAL INDUSTRY CO. LTD.).

The resin composition of the present invention can be easily manufactured by hot-melt-kneading the above components by using a heat roll, a kneader, or an extruder, by mixing the above components by using a special mixer capable of pulverizing, and by an arbitrary combination of these methods.

The resin encapsulated semiconductor device of the present invention is manufactured by resin-encapsulating a semiconductor pellet by using the above resin composition. In this case, low-pressure transfer molding is most generally used. Encapsulating, however, can be performed by injection molding, compression molding, or casting. After encapsulating, aftercuring is preferably performed at a temperature of 150° C. or more. Note that a semiconductor pellet to be encapsulated by the encapsulant of the present invention is not particularly limited.

EXAMPLES 1-11 & COMPARATIVE EXAMPLES 1-5

The following components were used as materials.

Epoxy resin A: Tris(hydroxyphenyl)methane-based epoxy resin (EPPN-502 available from NIPPON KAYAKU CO., LTD.: equivalent weight=167)

Epoxy resin B: Tris(hydroxyalkylphenyl)methane-based epoxy resin (ESX-221 available from SUMITOMO CHEMICAL CO., LTD.: equivalent weight=213)

Epoxy resin C: Tetrahydroxyphenylethane-based epoxy resin (E-1031S available from YUKA SHELL EPOXY: equivalent weight=196)

Epoxy resin D: Orthocresol-novolak epoxy resin (ESCN-195XL available from SUMITOMO CHEMICAL CO., LTD.: equivalent weight=197)

Epoxy resin E: Bisphenol A-type brominated epoxy resin (AER-755 available from ASAHI KASEI INDUSTRY CO., LTD.: equivalent weight=460)

Curing agent A: Phenol-novolak resin

Curing agent B: Tris(hydroxyphenyl)methane

Curing agent C: Aromatic polyamine (MC-810 available from Mitsubishi YUKA Co., Ltd.: amino group equivalent weight=124)

Curing agent D: 3,3',4,4'-benzophenonetetracarboxylic anhydride (molecular weight=321)

Maleimide resin A: A prepolymer prepared by blending 0.5 mol of 1,3-bis(4-aminophenoxy)benzene to one mol of diphenylmethane-N,N'-bismaleimide (molecular weight=358) represented by the following formula:

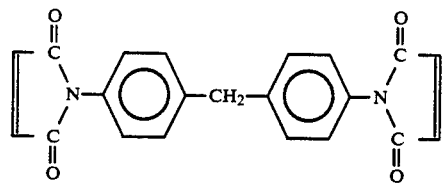

and hot-melt-mixing these materials at a resin temperature of 120° C. by using a biaxial extruder. Maleimide resin B: A prepolymer prepared by blending 0.5 mol of 1,3-bis(4-aminophenoxy)benzene represented by the following formula:

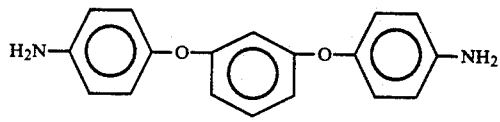

to one mol of 2,2'-bis(4-phenoxyphenyl)propane-N,N'-bismaleimide (molecular weight=600.5) represented by the following formula:

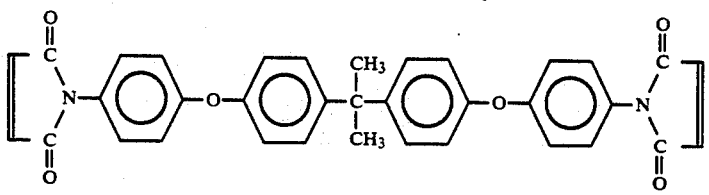

and hot-melt-mixing these materials at a resin temperature of 120° C by using a biaxial extruder as described above.

Curing accelerator A: Triphenylphosphine (PP-360 available from KI Kasei K.K.)

Curing accelerator B: Imidazole (C17Z available from Shikoku KASEI Corp.)

Silicone gel: Heat-curable adduct-type silicone gel

MBS: Average grain size = 30μm

ABS: Average grain size = 30μm

Lubricant: Zirconium chelate-modified ester wax

Pigment: Carbon black (CB#30 available from Mitsubishi YUKA Co., Ltd.)

Fire-retardant assistant: Antimony trioxide

Molten silica A: Granulated, average grain size = 20 μm (U and Th concentrations = 0.1 ppb)

Molten silica B: Sphere, Average grain size = 14 μm U and Th concentrations = 0.1 ppb)

Ion trapping agent: IXE-600 (TOAGOSEI CHEMICAL INDUSTRY CO., LTD.)

The silicone gel and the MBS or ABS was dispersed in the components of the thermosetting resin beforehand. That is, the curing agent A or B (phenolic resin) in each of Examples 1 to 4 and 9 to 11 or the epoxy resin A or D in each of Examples 5 and 6 was heated/melted at a temperature higher than a softening point of the resin in a universal stirring machine, the silicone gel and the MBS or ABS powder were added to the resultant resin. The resultant mixture was stirred and mixed so that the added silicone gel and the MBS or ABS powder were homogeneously dispersed. In each of Examples 7 and 8, in order to prepare a maleimide resin prepolymer by using a biaxial extruder, the silicone gel and the MBS were added to the melted resin, and a high shearing stress was applied to mix and disperse the added silicone gel and the MBS.

These components were blended at blending ratios (wt %) listed in Table 1 and kneaded by two rolls to form a sheet-like material. The obtained sheet-like material was granulated to prepare a semiconductor encapsulating resin composition.

The epoxy resin composition prepared in each of Examples 1 to 11 and Comparative Examples 1 to 5 was tested as follows.

(1) Each resin composition was used to form a test piece by transfer molding at 175° C. for three minutes, and the obtained test piece was aftercured at 200° C. for eight hours in each of Examples 5 to 8, or at 180° C. for eight hours in each of the other Examples. The resultant test piece was subjected to measurements of a thermal expansion coefficient, a glass transition temperature, a flexural strength at 215° C., a flexural modulus at room temperature, a volume resistivity at 150° C., and an adhesion strength with respect to a copper alloy as a frame member.

Note that the glass transition temperature was measured by using DL-1500H (available from Shinku Riko K.K.) as a measuring instrument and heating a 2.5-mm×2.5-mm×15.0- to 20.0-mm sample at a heating rate of 5° C./min. Values of the thermal expansion coefficient in Table 2 are measured at a temperature lower than the glass transition temperature.

(2) In order to check a thermal shock resistance, the following test was conducted. That is, each resin composition was used to encapsulate a large semiconductor pellet (8 mm×8 mm) for the thermal shock resistance test, and a heat cycle of $-65°$ C.→room temperature→150° C. was repeated 50 to 400 times, thereby checking a percentage of defective products by a device operational characteristic check.

(3) In order to check a humidity resistance reliability, the following test was conducted. That is, each resin composition was used to encapsulate a semiconductor pellet for the test at 175° C. for three minutes, and aftercuring was performed at 180° C. or 200° C. for eight hours. This package was left to stand in a pressure cooker at 2.5 atm., and a percentage of defective products was examined.

(4) In order to check a solder dipping property, each resin composition was used to encapsulate a semiconductor pellet for the test at 175° C. for three minutes, and aftercuring was performed at 180° C. or 200° C. for of eight hours. This package was left to stand in an atmosphere at a relative humidity of 85% for 72 hours to perform a moisture absorbing treatment and dipped in a solder bath at 260° C. for five seconds to check a percentage of cracked packages. Subsequently, the package dipped in the solder was left to stand in the saturated water vapor atmosphere at 127° C. for 100 to 400 hours to check a percentage of defective products (a leakage defect and an open defect).

The above measurement results are summarized in Table 2.

As shown in Table 2, the resin composition according to each of Examples 1 to 11 has higher heat resistance and adhesive properties than those of the resin composition according to each of Comparative Examples 1 to 4 and has a very high crack resistance at a high temperature and a very high humidity resistance reliability after being exposed to a high temperature. In addition, since the resin composition according to each of Examples 1 to 11 has balanced mechanical characteristics, it has a high thermal shock resistance.

Additional advantages and modifications will readily occur to those skilled in the art. Therefore, the invention in its broader aspects is not limited to the specific details, and examples described herein. Accordingly, various modifications may be without departing from the spirit or scope of the general inventive concept as defined by the appended claims and their equivalents.

TABLE 1

| | Examples | | | | | | | | | | | Comparative Examples | | | | |
|---|---|---|---|---|---|---|---|---|---|---|---|---|---|---|---|---|
| | 1 | 2 | 3 | 4 | 5 | 6 | 7 | 8 | 9 | 10 | 11 | 1 | 2 | 3 | 4 | 5 |
| Epoxy Resin | | | | | | | | | | | | | | | | |
| A | 8.9 | 8.6 | — | — | — | (9.6) | — | — | — | — | — | — | — | — | — | — |
| B | — | — | 9.6 | — | — | — | — | — | 9.6 | 9.6 | 9.6 | 11.1 | 10.3 | 10.7 | — | — |
| C | — | — | — | 9.2 | — | — | — | — | — | — | — | — | — | — | — | 9.6 |
| D | — | — | — | — | (11.1) | — | 2.6 | 2.7 | — | — | — | — | — | — | 9.3 | — |
| E | 2.5 | 2.5 | 2.5 | 2.5 | 2.5 | 2.5 | 2.5 | 2.5 | 2.5 | 2.5 | 2.5 | 2.5 | 2.5 | 2.5 | 2.5 | 2.5 |
| Curing Agent | | | | | | | | | | | | | | | | |
| A | — | (0.6) | — | (5.4) | 0.1 | — | — | — | — | — | — | — | — | — | (5.4) | — |
| B | (5.8) | — | (5.0) | — | — | — | — | — | (0.5) | (0.5) | (0.5) | 5.6 | (5.4) | (5.4) | — | (5.0) |
| C | — | — | — | — | 3.8 | — | — | — | — | — | — | — | — | — | — | — |
| D | — | — | — | — | — | 5.0 | — | — | — | — | — | — | — | — | — | — |
| Curing Accelerator | | | | | | | | | | | | | | | | |
| A | 0.1 | — | — | — | — | — | 0.15 | 0.1 | — | — | — | — | — | — | 0.1 | 0.1 |
| B | — | 0.2 | 0.2 | 0.2 | — | 0.2 | — | — | 0.2 | 0.2 | 0.2 | 0.2 | 0.2 | 0.2 | — | — |
| Maleimide Resin | | | | | | | | | | | | | | | | |
| A | — | — | — | — | — | — | (12.0) | — | — | — | — | — | — | — | — | — |
| B | — | — | — | — | — | — | — | (12.1) | — | — | — | — | — | — | — | — |
| Silicon Gel | (0.1) | (0.1) | (0.1) | (0.1) | (0.1) | (0.1) | (0.1) | (0.1) | (0.1) | (0.1) | (0.1) | — | — | (0.1) | (0.1) | (0.1) |
| M B S | (1.5) | (1.5) | (1.5) | (1.5) | (1.5) | (1.5) | (1.5) | (1.5) | — | (1.5) | (1.5) | — | (1.5) | — | (1.5) | (1.5) |
| A B S | — | — | — | — | — | — | — | — | (1.5) | — | — | — | — | — | — | — |
| Lubricant | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4*[2] |
| Pigment | 0.3 | 0.3 | 0.3 | 0.3 | 0.3 | 0.3 | 0.3 | 0.3 | — | — | — | 0.3 | 0.3 | 0.3 | 0.3 | 0.3 |
| Fire Retardant Assistant | 2 | 2 | 2 | 2 | 2 | 2 | 2 | 2 | 2 | 2*[1] | 2 | 2 | 2 | 2 | 2 | 2 |
| Molten Silica A | 60 | 60 | 60 | 60 | 60 | 60 | 60 | 60 | 60 | 60 | 60 | 60 | 60 | 60 | 60 | 60 |
| Molten Silica B | 15 | 15 | 15 | 15 | 15 | 15 | 15 | 15 | 15 | 15 | 15 | 15 | 15 | 15 | 15 | 15 |
| Ion Trapping Agent | — | — | — | — | — | — | — | — | — | — | 0.7 | — | — | — | — | — |

In each resin composition, a component in ( ) was preliminarily mixed beforehand together with a silicone-based surfactant (SF-821, 0.07 wt %).
*[1] The surface of an antimony trioxide was subjected to a hydrophobic treatment.
*[2] A normal ester-based lubricant not containing a metal chelate compound.

TABLE 2

| | Examples | | | | | | | | | | | Comparative Examples | | | | |
|---|---|---|---|---|---|---|---|---|---|---|---|---|---|---|---|---|
| | 1 | 2 | 3 | 4 | 5 | 6 | 7 | 8 | 9 | 10 | 11 | 1 | 2 | 3 | 4 | 5 |
| Glass Transition Temperature (C.°) | 200 | 210 | 205 | 215 | 210 | 200 | 220 | 215 | 200 | 200 | 200 | 203 | 204 | 204 | 168 | 200 |
| Thermal Expansion Coefficient (kg mm$^{-2}$) | 1.6 | 1.6 | 1.6 | 1.6 | 1.6 | 1.6 | 1.4 | 1.4 | 1.6 | 1.6 | 1.6 | 1.7 | 1.7 | 1.6 | 1.6 | 1.6 |
| Flexural Modulus [Room Temperature] ($10^{-5}$ deg$^{-1}$) | 1200 | 1210 | 1200 | 1220 | 1260 | 1260 | 1280 | 1220 | 1180 | 1220 | 1250 | 1560 | 1400 | 1350 | 1200 | 1210 |
| Flexural Strength [at 215° C.] (kg mm$^{-2}$) | 4.0 | 4.2 | 4.1 | 4.5 | 4.2 | 4.0 | 8.1 | 7.5 | 4.0 | 4.1 | 4.1 | 4.0 | 4.0 | 4.0 | 1.8 | 4.0 |
| Volume Resistivity [at 150° C.] ($10^{13}$ Ωcm) | 10 | 1 | 1 | 1 | 10 | 1 | 10 | 30 | 1 | 10 | 0.5 | 1 | 1 | 1 | 10 | 10 |
| Adhesive Strength (kg cm$^{-2}$) | 5.0 | 5.5 | 5.0 | 5.0 | 5.5 | 5.3 | 5.0 | 5.9 | 5.1 | 5.0 | 5.0 | 0.5 | 0.5 | 4.3 | 5.7 | 3.0 |
| Heat Cycle Test (Number of Defective Samples) | | | | | | | | | | | | | | | | |
| 50 | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 |
| 100 | 0/20 | 0/20 | 0/20 | 0/20 | 0/20 | 0/20 | 0/20 | 1/20 | 1/20 | 0/20 | 0/20 | 20/20 | 0/20 | 0/20 | 1/20 | 1/20 |
| 150 | 0/20 | 0/20 | 0/20 | 0/20 | 0/20 | 0/20 | 0/20 | 0/20 | 0/20 | 0/20 | 0/20 | 8/20 | 3/20 | 3/20 | 4/20 | 1/20 |
| 300 | 0/120 | 2/20 | 0/20 | 0/20 | 0/20 | 0/20 | 0/20 | 0/20 | 0/20 | 0/120 | 0/20 | 20/20 | 20/20 | 20/20 | 20/20 | 7/20 |
| 400 | 3/20 | 4/20 | 3/20 | 0/20 | 3/20 | 3/20 | 0/20 | 0/20 | 2/20 | 0/20 | 0/20 | — | — | — | — | 7/20 |
| Pressure Cooker Test (Number of Defective Samples) | | | | | | | | | | | | | | | | |
| 300 hrs | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 |

TABLE 2-continued

| | Examples | | | | | | | | | | | Comparative Examples | | | | |
|---|---|---|---|---|---|---|---|---|---|---|---|---|---|---|---|---|
| | 1 | 2 | 3 | 4 | 5 | 6 | 7 | 8 | 9 | 10 | 11 | 1 | 2 | 3 | 4 | 5 |
| 500 hrs | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 |
| 1000 hrs | 0/20 | 0/20 | 0/20 | 0/20 | 0/20 | 0/20 | 0/20 | 0/20 | 0/20 | 0/20 | 0/20 | 1/20 | 2/20 | 0/20 | 1/20 | 0/20 |
| 1500 hrs | 1/20 | 2/20 | 1/20 | 2/20 | 0/20 | 3/20 | 0/20 | 0/20 | 2/20 | 1/20 | 2/20 | 3/20 | 4/20 | 3/20 | 3/20 | 5/20 |
| 2000 hrs | 2/20 | 3/20 | 3/20 | 4/20 | 1/20 | 5/20 | 0/20 | 0/20 | 5/20 | 2/20 | 3/20 | 5/20 | 5/20 | 5/20 | 8/20 | 6/20 |
| Percentage of Cracks After Solder Dipping and Pressure Cooker Test (Number of Defective Samples) | | | | | | | | | | | | | | | | |
| Crack | 0/20 | 0/20 | 0/20 | 0/20 | 0/20 | 0/20 | 0/20 | 0/20 | 0/20 | 0/20 | 0/20 | 5/20 | 4/20 | 1/20 | 20/20 | 8/20 |
| 100 hrs | 0/20 | 0/20 | 0/20 | 0/20 | 0/20 | 0/20 | 0/20 | 0/20 | 0/20 | 0/20 | 0/20 | 2/20 | 3/20 | 0/20 | 20/20 | 8/20 |
| 200 hrs | 0/20 | 0/20 | 0/20 | 0/20 | 0/20 | 0/20 | 0/20 | 0/20 | 0/20 | 0/20 | 0/20 | 20/20 | 20/20 | 0/20 | — | 10/20 |
| 300 hrs | 1/20 | 0/20 | 0/20 | 1/20 | 0/20 | 0/20 | 0/20 | 0/20 | 0/20 | 0/20 | 0/20 | — | — | 3/20 | — | 20/20 |
| 400 hrs | 1/20 | 1/20 | 0/20 | 2/20 | 0/20 | 2/20 | 0/20 | 0/20 | 0/20 | 0/20 | 0/20 | — | — | 5/20 | — | — |

What is claimed is:

1. A semiconductor device encapsulated by a resin encapsulant, said encapsulant comprising:
   (a) a thermosetting resin for providing a cured product having a glass transition temperature of not less than 190° C.;
   (b) a filler consisting of a fused silica;
   (c) a modifier consisting of a methylmethacrylate/butadiene/styrene copolymer or an acrylonitrile/butadiene/styrene copolymer;
   (d) a modifier consisting of a silicone rubber or a silicone gel; and
   (e) a lubricant containing a metal chelate compound.

2. A semiconductor device according to claim 1, wherein said thermosetting resin consists of an epoxy resin and a curing agent.

3. A semiconductor device according to claim 2, further comprising a curing accelerator.

4. A semiconductor device according to claim 2, wherein said curing agent is contained in an amount of 0.5 to 1.5 equivalent weight per equivalent weight of said epoxy resin.

5. A semiconductor device according to claim 3, wherein said curing accelerator is contained in an amount of 0.1 to 5 wt % with respect to a total amount of said epoxy resin and said curing agent.

6. A semiconductor device according to claim 1, wherein said thermosetting resin is a maleimide resin.

7. A semiconductor device according to claim 6, wherein said maleimide resin is hot-melt-mixed to be prepolymerized together with an amine.

8. A semiconductor device according to claim 7, further comprising a curing accelerator.

9. A semiconductor device according to claim 7, wherein said amine is contained in an amount of 0.2 to 0.8 mol per mol of said maleimide resin.

10. A semiconductor device according to claim 9, further comprising an epoxy resin in an amount of 5 to 50 wt % with respect to a total amount of said maleimide resin and said amine.

11. A semiconductor device according to claim 9, further comprising an organic phosphine in an amount of 0.1 to 10 wt % with respect to a total amount of said maleimide resin and said amine.

12. A semiconductor device according to claim 1, wherein said fused silica is contained in an amount of 65 to 90 wt %.

13. A semiconductor device according to claim 1, wherein said MBS or ABS is contained in an amount of 0.1 to 10 wt %.

14. A semiconductor device according to claim 1, wherein said silicone rubber or silicone gel is contained in an amount of 0.1 to 5 wt %.

15. A semiconductor device according to claim 1, wherein said MBS or ABS and said silicone rubber or silicone gel is hot-melt-mixed beforehand together with components of said thermosetting resin.

16. A semiconductor device according to claim 1, wherein said lubricant containing the metal chelate compound is contained in an amount of 0.01 to 3 wt %.

17. A semiconductor device according to claim 1, further comprising 0.2 to 5 wt % of an antimony trioxide as a fire retardant assistant.

18. A semiconductor device according to claim 1, further comprising a coupling agent, a fire retardant agent, and a pigment.

* * * * *